United States Patent
Tanaka et al.

(10) Patent No.: US 10,615,293 B2
(45) Date of Patent: Apr. 7, 2020

(54) DIODE AND METHOD OF MANUFACTURING DIODE

(71) Applicant: FUJI ELECTRIC CO., LTD., Kanagawa (JP)

(72) Inventors: Ryo Tanaka, Hino (JP); Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 24 days.

(21) Appl. No.: 16/174,282

(22) Filed: Oct. 30, 2018

(65) Prior Publication Data
US 2019/0165187 A1 May 30, 2019

(30) Foreign Application Priority Data
Nov. 29, 2017 (JP) .................. 2017-229680

(51) Int. Cl.
*H01L 29/15* (2006.01)
*H01L 29/872* (2006.01)
*H01L 29/06* (2006.01)
*H01L 27/08* (2006.01)
(Continued)

(52) U.S. Cl.
CPC ........ *H01L 29/872* (2013.01); *H01L 27/0814* (2013.01); *H01L 29/0619* (2013.01); *H01L 29/0657* (2013.01); *H01L 29/0688* (2013.01); *H01L 29/0692* (2013.01);
(Continued)

(58) Field of Classification Search
CPC ............. H01L 29/782; H01L 29/0619; H01L 29/0657; H01L 29/0688; H01L 29/0692
See application file for complete search history.

(56) References Cited

U.S. PATENT DOCUMENTS 10,056,502 B2  8/2018  Aketa
2012/0038018 A1*  2/2012  Yamada ............ H01L 27/14663
257/458

(Continued)

FOREIGN PATENT DOCUMENTS

JP  2013030618 A  2/2013
JP  2014241345 A  12/2014
(Continued)

OTHER PUBLICATIONS

Office Action issued for counterpart Japanese Application 2017-229680, drafted by the Japan Patent Office dated Apr. 18, 2018.

*Primary Examiner* — Phuc T Dang

(57) ABSTRACT

A diode is provided, the diode including: a semiconductor layer of a first conductivity type, configured to have a trench structure and be an epitaxial layer of a wide gap semiconductor; a semiconductor layer of a second conductivity type, configured to be at least in contact with a side wall of the trench structure and be an epitaxial layer of the wide gap semiconductor; and an electrode configured to be in contact with the semiconductor layer of the first conductivity type and the semiconductor layer of the second conductivity type, on the semiconductor layer of the first conductivity type and the semiconductor layer of the second conductivity type.

11 Claims, 13 Drawing Sheets

(51) Int. Cl.
  *H01L 29/66*   (2006.01)
  *H01L 29/20*   (2006.01)
(52) U.S. Cl.
  CPC .... *H01L 29/66212* (2013.01); *H01L 29/0649* (2013.01); *H01L 29/2003* (2013.01)

(56) References Cited

U.S. PATENT DOCUMENTS

| | | | | |
|---|---|---|---|---|
| 2015/0035002 | A1* | 2/2015 | Weber | H01L 29/66734 257/139 |
| 2016/0005826 | A1* | 1/2016 | Uchida | H01L 21/045 257/76 |
| 2017/0108937 | A1* | 4/2017 | Kim | G06F 3/0202 |

FOREIGN PATENT DOCUMENTS

| | | |
|---|---|---|
| JP | 2015130388 A | 7/2015 |
| JP | 2015207780 A | 11/2015 |

\* cited by examiner

DIODE AND METHOD OF MANUFACTURING DIODE

The contents of the following Japanese patent application are incorporated herein by reference:
NO. 2017-229680 filed in JP on Nov. 29, 2017.

BACKGROUND

1. Technical Field

The present invention relates to a diode and a manufacturing method of the diode.

2. Related Art

It has been known that a Junction Barrier Schottky (hereinafter, JBS) structure is formed by performing ion implantation of P type impurities into an N type drift layer (for example, see Patent Document 1).

PRIOR ART LITERATURE

Patent Document

[Patent Document 1] Japanese Patent Application Publication No. 2013-30618

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
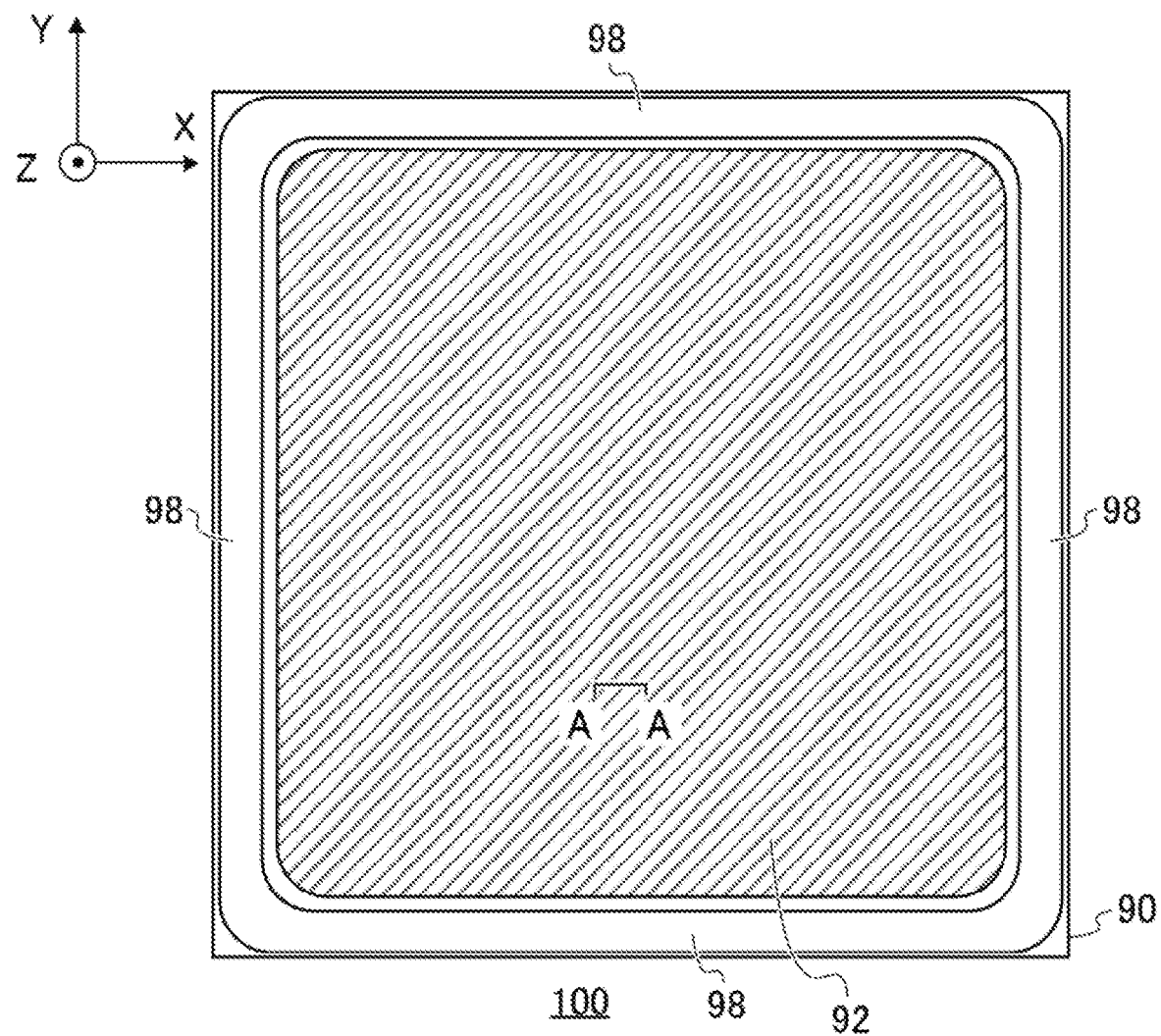
FIG. 1 shows a top view of a diode 100.

FIG. 1 is a top view of a diode 100. The diode 100 of the present example has an active portion 92 and an edge termination portion 98. The active portion 92 of the present example is a portion surrounded by the edge termination portion 98 in an X-Y plane direction. In the active portion 92, currents may flow in a thickness direction of the semiconductor chip 90. Although the details will be described below, the active portion 92 of the present example is provided with a diode having a JBS structure.

In the present example, an X-axis direction and a Y-axis direction are directions orthogonal to each other, and a Z-axis direction is a direction orthogonal to the X-Y plane. The X, Y, and Z axes form a so-called right-handed system. In the present example, a positive side of the Z-axis direction (+Z direction) is referred to as an "upper" direction and a negative side of the Z-axis direction (−Z direction) is referred to as a "lower" direction in some cases. Note that the terms "upper" and "lower" do not necessarily mean a direction vertical to the grounds. That is, the "upper" and "lower" directions are not limited to the gravity direction. The terms "upper" and "lower" are merely expressions for the sake of convenience to specify a relative position relation between regions, layers, films, substrates and the like.

The edge termination portion 98 may have a function of relaxing electric field concentration in the vicinity of a front surface of the semiconductor chip 90. The edge termination portion 98 has a structure of, for example, a guard ring, a field plate, a resurf, and a combination thereof. By providing the edge termination portion 98, a breakdown voltage of the diode 100 can be more improved compared to a case in which no edge termination portion 98 is provided.

The semiconductor chip 90 may be a chip mainly having a wide gap semiconductor. The wide gap semiconductor may mean a semiconductor having a bandgap larger than a bandgap of silicon. The wide gap semiconductor may be a GaN containing a slight amount of Al and In (that is, $Al_xIn_yGa_{1-x-y}N$ ($0 \leq x < 1$, $1 \leq y < 1$)), may be silicon carbide (hereinafter, SiC), or may be diamond. Note that the wide gap semiconductor of the present example is GaN ($Al_xIn_yGa_{1-x-y}N$, where x=y=0).

Figure 2:
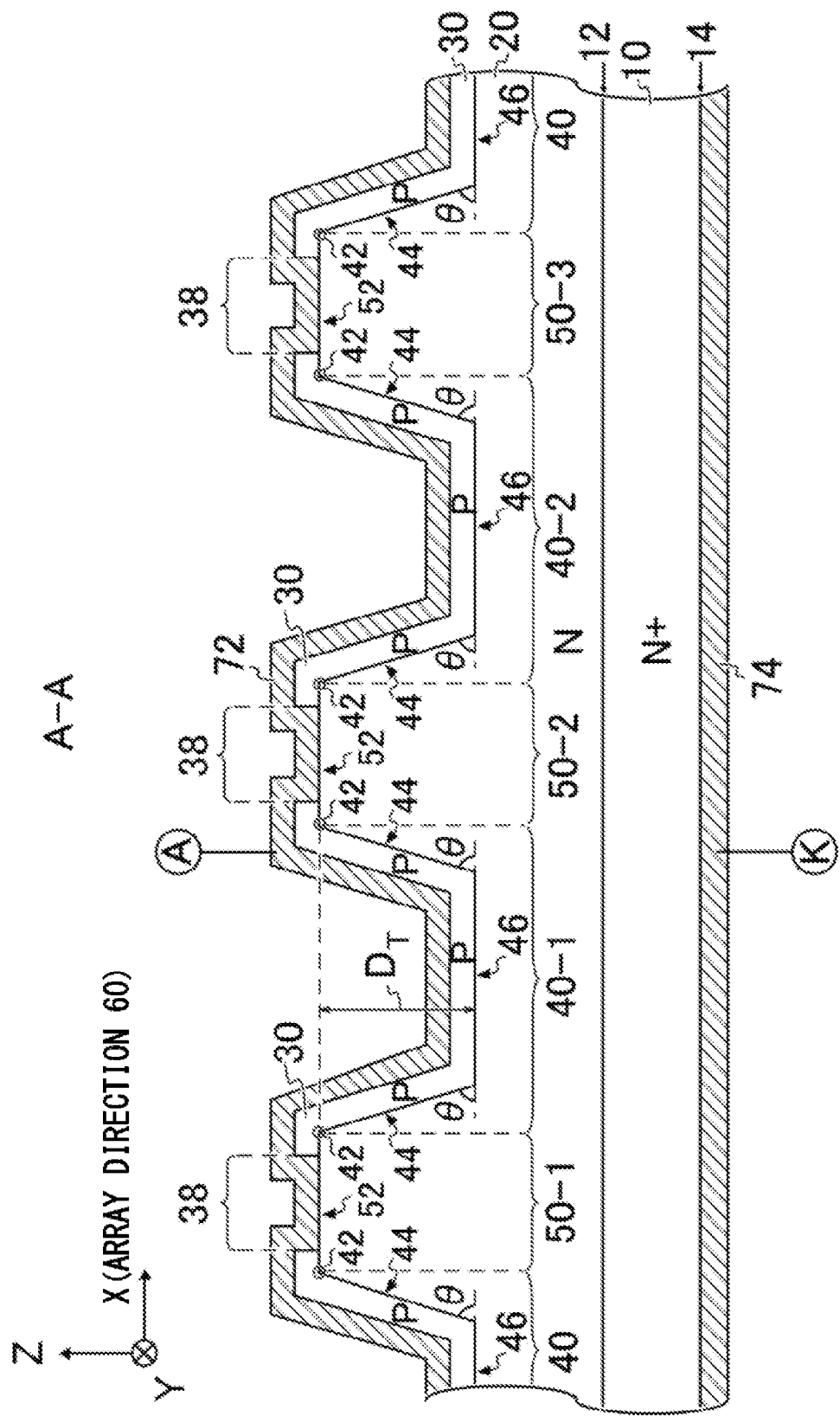
FIG. 2 shows an A-A cross-section view of FIG. 1 in a first embodiment.

FIG. 2 shows an A-A cross-section view of FIG. 1 in a first embodiment. The A-A cross section shows parts of an X-Z cross section of the active portion 92. The active portion 92 of the present example has an N+ type GaN substrate 10, an N type GaN layer 20, a P type GaN layer 30, an anode electrode 72 and a cathode electrode 74. The N+ type GaN substrate 10 of the present example is a free-standing substrate with a top surface 12 having a plane orientation of (0001) plane. The cathode electrode 74 is in contact with a lower surface 14 of the N+ type GaN substrate 10.

In the present example, the N+ type GaN substrate 10 is a substrate of the above-described wide gap semiconductor. Also, in the present example, the N type GaN layer 20 and the P type GaN layer 30 are epitaxial layers of the above-described wide gap semiconductor. In the present example, because the P type GaN layer 30 is formed by epitaxial growth, difficulty of forming the P type GaN layer by the ion implantation or selective regrowth can be avoided, and the P type GaN layer 30 can be surely provided on the trench structure 40.

The N type GaN layer 20 is one example of the semiconductor layer of the first conductivity type, and the P type GaN layer 30 is one example of the semiconductor layer of the second conductivity type. In the present example, the first conductivity type is N type and the second conductivity type is P type. However, in another example, the first conductivity type may also be P type and the second conductivity type may also be N type. In the present specification, N or P respectively means that electrons or holes are majority carriers. When the sign "+" is suffixed, the letters "P" and "N" represent a higher carrier concentration than when it is not. Likewise, when the sign "−" is suffixed, the letters "P" and "N" represent a lower carrier concentration than when it is not.

N type dopants to GaN may be one or more types of elements of silicon (Si), germanium (Ge) and oxygen (O). In the present example, silicon may be used as the N type dopants. Also, P type dopants to GaN may be one or more types of elements of magnesium (Mg), calcium (Ca), beryllium (Be) and zinc (Zn). In the present example, magnesium is used as the P type dopants. N type dopants to SiC may be one or more types of elements nitrogen (N) and phosphorus (P), and P type dopants to SiC may be one or more types of elements of aluminum (Al) and boron (B).

The N type GaN layer 20 is in contact with the top surface 12 of the N+ type GaN substrate 10. The N type GaN layer 20 may have a plurality of trench structures 40 and a plurality of mesa structures 50. In the N type GaN layer 20 of the present example, the plurality of trench structures 40 are arrayed to be spaced away from each other in the X-axis direction. In the present example, the X-axis direction is parallel to an array direction 60 in which the plurality of trench structures 40 are arrayed. The plurality of mesa structures 50 are positioned between every two adjacent trench structures in the array direction 60. That is, in the array direction 60, the trench structure 40 and the mesa structure 50 are alternately provided.

The P type GaN layer 30 is provided in contact with the N type GaN layer 20. The P type GaN layer 30 may be at least in contact with a side wall of the trench structure 40. Also, the P type GaN layer 30 may be at least in contact with a part of a top portion 52 of the mesa structure 50. Except the part of the top portion 52 of the mesa structure 50, the P type GaN layer 30 of the present example is in contact with each of the entire side wall 44, the entire bottom 46, and the top portion 52 of the N type GaN layer 20. Note that the P type GaN layer 30 of the present example has an opening 38 on the top portion 52 of the mesa structure 50. That is, the P type GaN layer 30 of the present example covers, except the opening 38, the entire trench structure 40 and mesa structure 50.

The trench structure 40 has a side wall 44 and a bottom 46. The top portion 42 of the side wall 44 of the trench structure 40 is positioned at the same position as that of the top portion 52 of the mesa structure 50 in the Z-axis direction. Note that although the top portion 42 of the side wall 44 is shown in a dotted shape on the A-A cross section, the top portion 42 may extend in the Y-axis direction in a top view. In the trench structure 40, the side wall 44 and the bottom 46 may form a predetermined angle θ. The angle θ may be an acute angle or a right angle. In the present example, the trench structure 40 is positioned between two top portions 42 interposing the bottom 46 therebetween and being adjacent to each other in the array direction 60. Also, the mesa structure 50 is positioned between two top portions 42 interposing the top portion 52 therebetween and being adjacent to each other in the array direction 60.

The anode electrode 72 may be in contact with the N type GaN layer 20 and the P type GaN layer 30 on the N type GaN layer 20 and the P type GaN layer 30. The anode electrode 72 of the present example is in direct contact with the N type GaN layer 20 in the opening 38 of the P type GaN layer 30. Accordingly, Schottky junction between the anode electrode 72 and the N type GaN layer 20 is provided. Accordingly, compared to a case in which no opening 38 is provided and the anode electrode 72 is in contact with the P type GaN layer 30 only, conductive resistance of a diode 100 can be more reduced. For that reason, a low start-up voltage that is approximately the same as that of a Schottky Barrier Diode (hereinafter, SBD; note that it is also called Schottky diode) can be realized.

Also, the anode electrode 72 of the present example is in direct contact with the P type GaN layer 30 above each of the top portion 52 except the opening 38, the side wall 44 and the bottom 46. Because the anode electrode 72 of the present example is electrically connected to P-N junction, when a forward bias is applied between the anode electrode 72 and the cathode electrode 74, currents caused by recombination of electrons and holes may also flow in the diode 100. In the present example, because the P type GaN layer 30 is also provided on the entire bottom 46 in addition to the side wall 44, an area in which currents flow can be more increased compared to a case in which the P type GaN layer 30 is provided on the side wall 44 only.

Further, in the present example, when a reverse bias is applied between the anode electrode 72 and the cathode electrode 74, a depletion layer may extend so as to continue over the top portion 52, the side wall 44 and the bottom 46. Accordingly, leakage currents at the time of applying the reverse bias can be more reduced compared to a SBD in which no P-N junction is provided and the entire anode electrode 72 is in contact with the N type GaN layer 20 only.

The angle θ in the trench structure 40 may be equal to or greater than 40 degrees and equal to or less than 90 degrees. As the angle θ is smaller, the P type GaN layer 30 is more easily epitaxially grown on the N type GaN layer 20. For example, a case in which the angle θ is between 40 degrees and 60 degrees, inclusive, or, as a further suitable example, between 40 degrees inclusive and 50 degrees exclusive (as a more specific example, angle θ=45 degrees), is more advantageous compared to a case in which the angle θ is larger than 60 degrees in that an optimum range (that is, Process Window) of a manufacturing condition for the epitaxial growth of the P type GaN layer 30 can be widened.

However, because a length of an inclined surface of the side wall 44 (a distance from the top portion 42 to the bottom 46 of the side wall 44 on an X-Z plane) is longer as the angle θ is smaller, a relative ratio of an area of a P-N junction region to an area of a Schottky junction region is increased. The more the relative ratio of the area of the P-N junction region is increased, the more a forward direction voltage $V_F$ is increased. Here, to prevent the increase of the relative ratio of the area of the P-N junction region (that is, decrease of the relative ratio of the area of the Schottky junction region), the angle θ may be set to be equal to or greater than 80 degrees and equal to or less than 90 degrees (as a more specific example, a predetermined angle of equal to or greater than 81 degrees and equal to or less than 89 degrees).

Note that in the present example, to provide a description easily, the mesa structure 50 positioned between a first trench structure 40-1 and a second trench structure 40-2, that are adjacent to each other in the array direction 60, is referred to as a second mesa structure 50-2. Also, the mesa structure 50 adjacent to the first trench structure 40-1 in a positive side of the X-axis direction is referred to as a first mesa structure 50-1, and the mesa structure 50 adjacent to the second trench structure 40-2 in a negative side of the X-axis direction is referred to as a third mesa structure 50-3.

Figure 3:
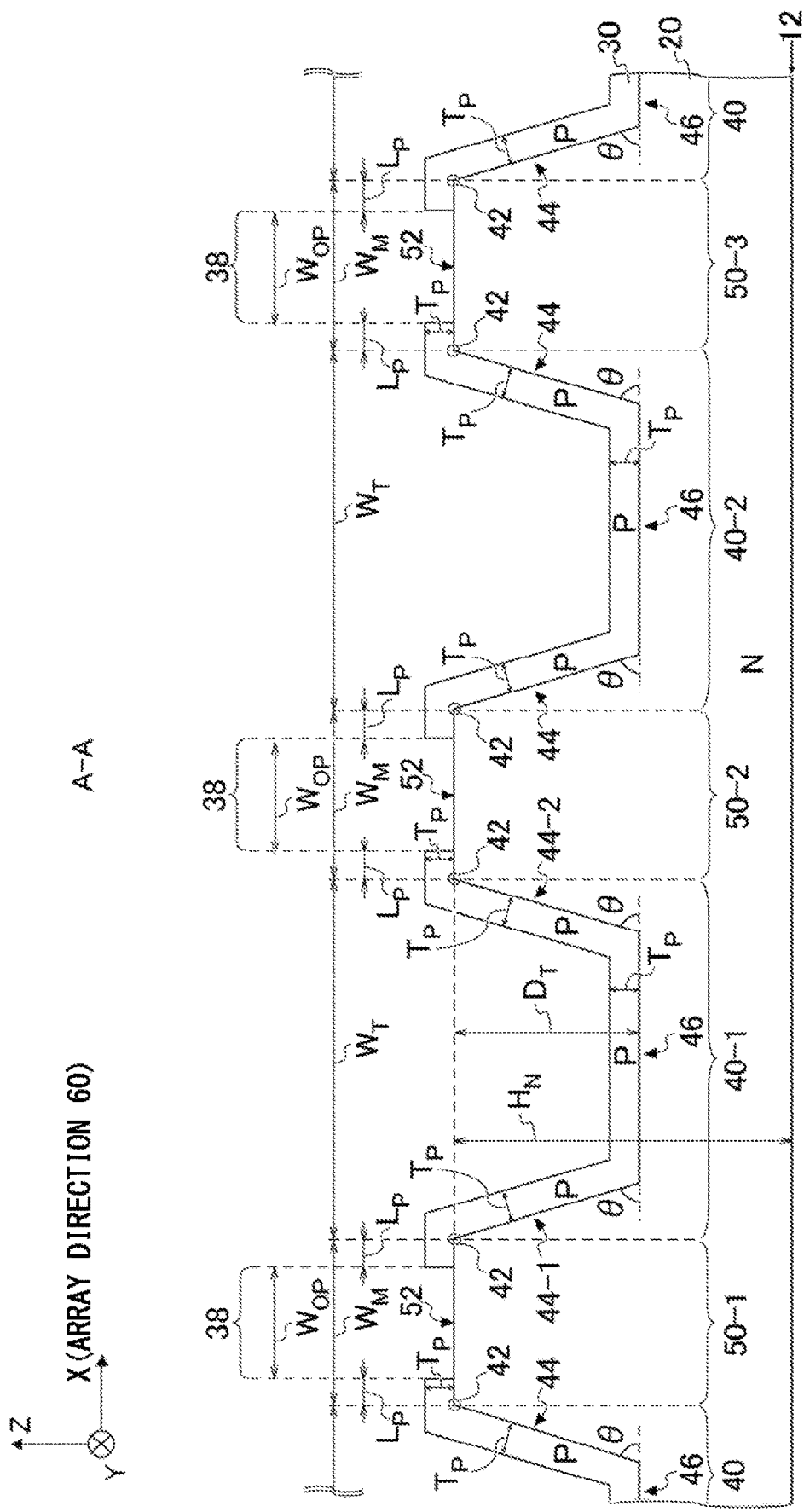
FIG. 3 illustrates dimensions of a width, a length, a depth and the like at the A-A cross section.

FIG. 3 is a drawing illustrating dimensions of a width, a length, a depth and the like at the A-A cross section. To provide a description easily, only the N type GaN layer 20 and the P type GaN layer 30 are shown in FIG. 3. A width $W_T$ of the trench structure 40 in the array direction 60 may be equal to or greater than 1 μm and equal to or less than 50 μm, may be equal to or greater than 1 μm and equal to or less than 20 μm, and may also be equal to or greater than 1 μm and equal to or less than 10 μm. The width $W_T$ of the present example is a length between two top portions 42 interposing the bottom 46 therebetween and being adjacent to each other in the array direction 60. The width $W_T$ of the present example is approximately 10 μm. For an easy understanding, a first side wall 44-1 and a second side wall 44-2 of the first trench structure 40-1 are shown in FIG. 3, the first side wall 44-1 and the second side wall 44-2 facing each other in the array direction 60.

In a case in which the P type GaN layer 30 is formed by selective regrowth, the width $W_T$ of the trench structure 40 needs to be equal to or greater than 400 μm. Note that in a case in which a P type SiC layer is formed on an N type SiC layer by selective regrowth, the width $W_T$ of trench structure 40 similarly also needs to be equal to or greater than 400 μm. On the other hand, in the present example, because a mask for selective regrowth is not used, the width $W_T$ can be set to be equal to or greater than 1 μm and equal to or less than 50 μm. In the present example, because the width $W_T$ of the trench structure 40 can be made smaller compared to the case of selective regrowth, the decrease of the relative ratio of the area of the Schottky junction region can be prevented.

The width $W_T$ of the trench structure 40 may be as 1 time or more as, and may also be as twice or more as a width $W_M$ of the mesa structure 50 in the array direction 60. As a ratio of the width $W_T$ to the width $W_M$ (that is, width $W_T$/width $W_M$) is smaller, Schottky characteristic of the diode 100 may be stronger. For example, as the width $W_T$/width $W_M$ is smaller, the forward direction voltage $V_F$ can be smaller.

On the other hand, as the width $W_T$/width $W_M$ is larger, the P-N junction characteristic of the diode 100 may be stronger. For example, as the width $W_T$/width $W_M$ is larger, voltage-current characteristic at the time of applying the forward bias can be improved and leakage currents at the time of applying the reverse bias can be reduce. In addition, as the width $W_T$/width $W_M$ is larger, the manufacturing condition for the epitaxial growth of the P type GaN layer 30 can be more easily controlled.

The width $W_M$ of the mesa structure 50 in the array direction 60 may be between 0.5 μm and 10 μm, inclusive. The width $W_M$ of the present example is a length between two top portions 42 interposing the top portion 52 therebetween and being adjacent to each other in the array direction 60. The width $W_M$ of the present example is several μm. A width $W_{op}$ of the opening 38 of the P type GaN layer 30 may be smaller than the width $W_M$ of the mesa structure 50. For that reason, the P type GaN layer 30 may also be provided on the top portion 52. The width $W_{OP}$ may be between 0.3 μm and 8 μm, inclusive, and may be between 1 μm and 2 μm, inclusive. On the top portion 52, the P type GaN layer 30 having a length $L_P$ of equal to or greater than 0.1 μm in the array direction 60 may be provided so as to interpose the opening 38 therebetween in the array direction 60.

The trench structure 40 of the present example has a depth $D_T$ being a length from the top portion 42 of the side wall 44 to the bottom 46 of the trench structure 40. The depth $D_T$ may be between 0.5 μm and 2 μm, inclusive. As the depth $D_T$ is larger, a depletion layer formed in a P-N junction region between the N type GaN layer 20 and the P type GaN layer 30 at the time of applying the reverse bias more easily interrupt the leakage currents. That is, as the depth $D_T$ is larger, a more sufficient pinch-off state can be obtained.

A height $H_N$ of the N type GaN layer 20 may be between 5 μm and 20 μm, inclusive. In the present example, the height $H_N$ of the N type GaN layer 20 is a length that is from the top surface 12 to the top portion 52 and is parallel to the Z-axis direction. A doping concentration Nd of N type dopants of the N type GaN layer 20 may be between 0.5E+16 cm$^{-3}$ and 2E+16 cm$^{-3}$, inclusive. Nd of the N type GaN layer 20 may be determined in accordance with a breakdown voltage of the diode 100. The smaller Nd is, the higher the breakdown voltage of the diode 100 is. Note that E is a power of 10 and 2E+16 means $2\times10^{16}$.

A thickness $T_P$ of the P type GaN layer 30 may be a thickness with which the trench structure 40 is not fully filled with the P type GaN layer 30. In the present example, the thickness $T_P$ of the P type GaN layer 30 is smaller than the depth $D_T$ of the trench structure 40. The thickness $T_P$ of the P type GaN layer 30 may be between 30 nm and 500 nm, inclusive (that is, between 0.03 μm and 0.5 μm, inclusive), and may also be between 100 nm and 200 nm, inclusive (that is, between 0.1 μm and 0.2 μm, inclusive). If the thickness $T_P$ is less than 30 nm, a sufficient P-N junction region cannot be obtained. On the other hand, if the thickness $T_P$ is larger than 500 nm, the resistance of the P type GaN layer 30 in the diode 100 gets too high. Note that by controlling the manufacturing condition, the thickness $T_P$ of the P type GaN layer 30 in contact with the side wall 44, the thickness $T_P$ of the P type GaN layer 30 in contact with the bottom 46 and the thickness $T_P$ of the P type GaN layer 30 in contact with the top portion 52 can be made the same.

The doping concentration Na of P type dopants may be between 1E+18 cm$^{-3}$ and 1E+20 cm$^{-3}$, inclusive, and more preferably, may be set to be between 5E+18 cm$^{-3}$ and 1E+19 cm$^{-3}$, inclusive. If Na is less than 1E+18 cm$^3$, there is an issue that the resistance of the P-N junction gets too high. For that reason, it is desirable that Na is set to be equal to or greater than 1E+18 cm$^{-3}$. Also, in a case in which Na exceeds 1E+20 cm$^{-3}$, because a number of Mg not activated in the P type GaN layer 30 increases, it is desirable that Na is set to be equal to or less than 1E+20 cm$^{-3}$.

The thickness $T_P$ and the doping concentration Na of the P type dopants may be determined to appropriate optimal values. The P type GaN layer 30 may have such a doping concentration Na and a thickness $T_P$ that the P type GaN layer 30 and the N type GaN layer 20 can provide a sufficient pinch-off state. As long as the sufficient pinch-off state can be obtained, the thickness $T_P$ may be made as small as possible. As the thickness $T_P$ is smaller, the resistance of the diode 100 can be reduced. Also, Although the details will be described below, the thickness $T_P$ that is smaller is also advantageous in that a position of an alignment marker provided on a wafer is more easily identified.

Figure 4:
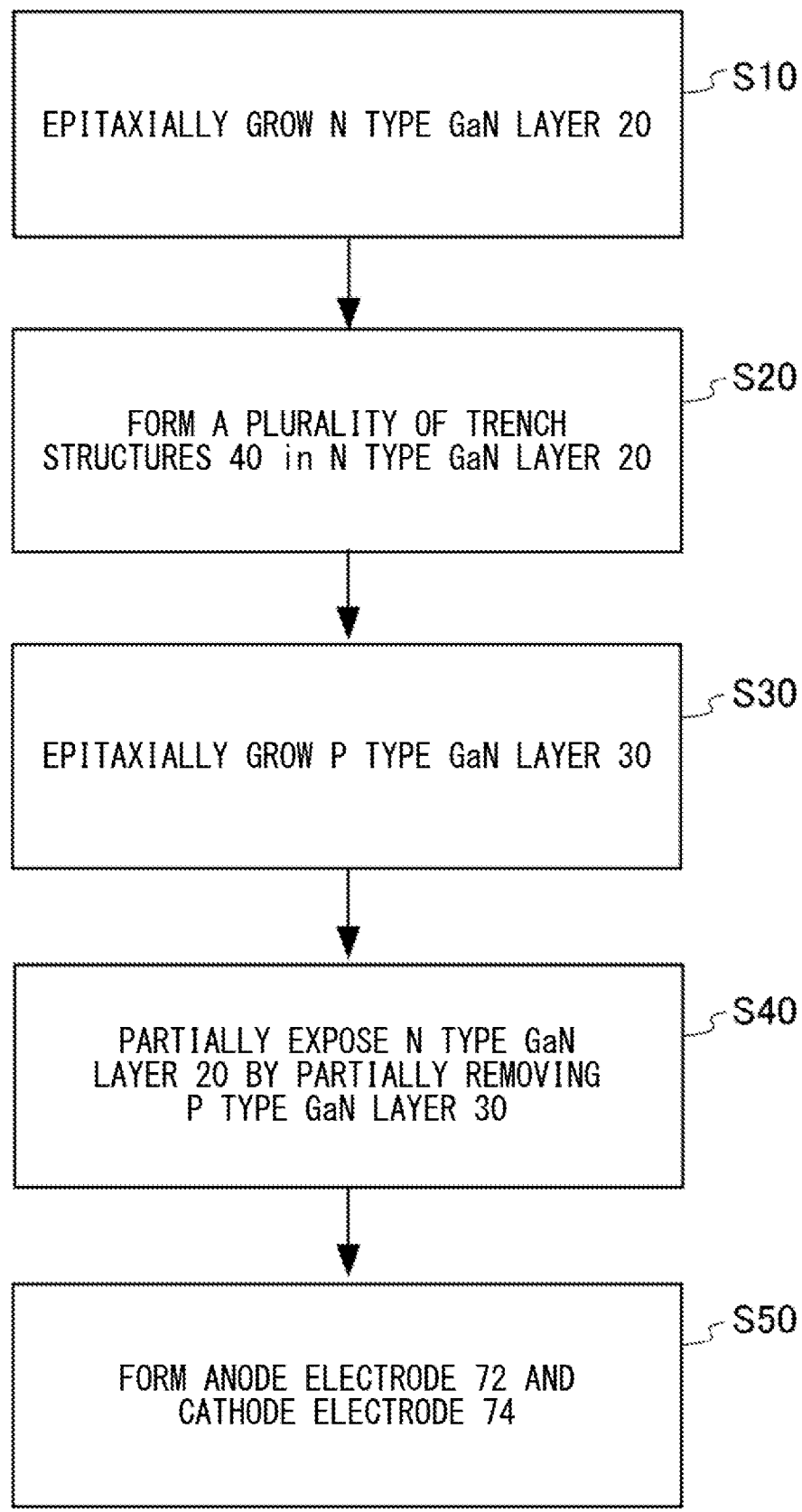
FIG. 4 shows a flow diagram of a manufacturing method of the diode 100.

FIG. 4 is a flow diagram of a manufacturing method of a diode 100. The manufacturing method of the present example includes: a step of epitaxially growing an N type GaN layer 20 (S10); a step of forming a plurality of trench structures 40 in the N type GaN layer 20 (S20); a step of epitaxially growing a P type GaN layer 30 (S30); a step of partially exposing the N type GaN layer 20 by partially removing the P type GaN layer 30 (S40); and a step of forming an anode electrode 72 and a cathode electrode 74 (S50). In the present example, the steps are performed in ascending order of the numbers added to the right side of the letter S.

Figure 5:
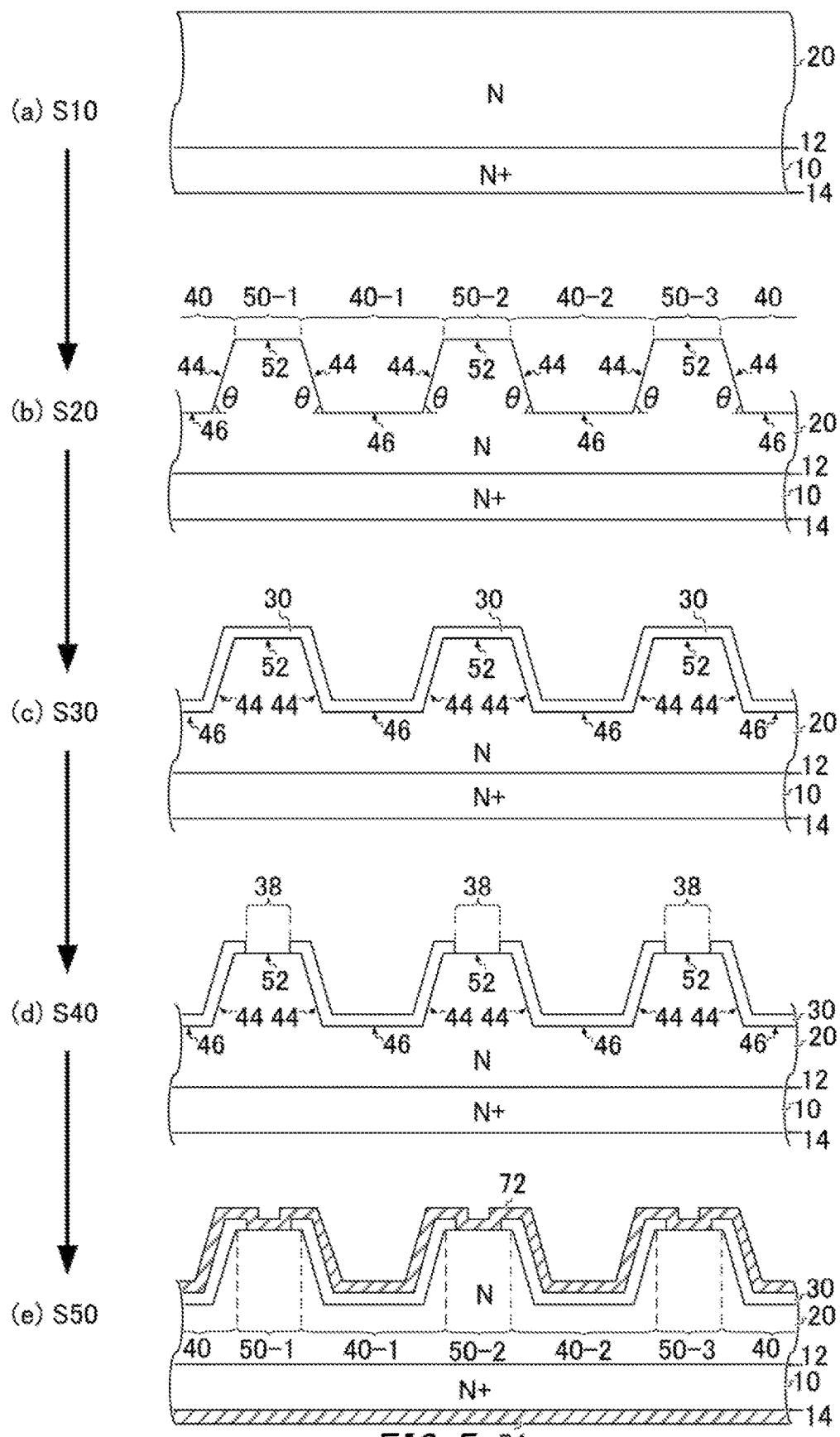
FIG. 5 illustrates, respectively as (a) to (e), each step of the manufacturing method of the diode 100.

FIG. 5 illustrates, respectively as (a) to (e), each step of the manufacturing method of the diode 100. FIG. 5 shows the step S10 as (a). In the step S10 of the present example, epitaxial growth of the N type GaN layer 20 is performed on the N+ type GaN substrate 10. The N type GaN layer 20 may be epitaxially formed by Metal Organic Chemical Vapor Deposition (MOCVD) method or Hydride Vapor Phase Epitaxy (HVPE) method. For example, the epitaxial growth of the N type GaN layer 20 is performed by the MOCVD method by supplying, on an N+ type GaN substrate 10, raw material gas containing trimethylgallium (TMGa), ammonia ($NH_3$) and silane ($SiH_4$) and pressing gas containing nitrogen ($N_2$) and hydrogen ($H_2$).

FIG. 5 shows the step S20 as (b). In the step S20 of the present example, a plurality of trench structures 40 and a plurality of mesa structures 50 are formed in the N type GaN layer 20 by partially etching the N type GaN layer 20. A trench can be formed by providing a mask layer on a portion corresponding to the mesa structure 50 by a known photolithography process and then dry-etching the N type GaN layer 20.

FIG. 5 shows the step S30 as (c). In the step S30 of the present example, the epitaxial growth of the P type GaN layer 30 is performed on the N type GaN layer 20 without providing a mask for selective regrowth above each trench structure 40 and each mesa structure 50. In the step S30 as well, the MOCVD method or HVPE method may be used. For example, the epitaxial growth of the P type GaN layer 30 is performed by the MOCVD method by supplying, on the N type GaN layer 20, raw material gas containing TMGa, $NH_3$ and bis(cyclopentadienyl)magnesium ($Cp_2Mg$) and pressing gas containing $N_2$ and $H_2$.

FIG. 5 shows the step S40 as (d). In the step S40 of the present example, an opening 38 is provided in the P type GaN layer 30 by partially etching the P type GaN layer 30 that is positioned on the mesa structure 50. Accordingly, the N type GaN layer 20 of the top portion 52 is partially exposed. The opening 38 can be formed by providing a mask layer, by the known photolithography process, on the entire P type GaN layer 30 except a portion corresponding to the opening 38 and then dry-etching the P type GaN layer 30.

FIG. 5 shows the step S50 as (e). In the step S50 of the present example, the anode electrode 72 and the cathode electrode 74 are sequentially formed by sputtering. The anode electrode 72 may have a stacking structure (Ni/Au) including a nickel (Ni) layer that is in direct contact with an exposed surface of the P type GaN layer 30 and with the exposed N type GaN layer 20 in the opening 38, and a gold (Au) layer that is in contact with the nickel layer on the nickel layer. The anode electrode 72 may also be partially etched to remove the anode electrode 72 on an end of the semiconductor chip 90 on the X-Y plane. The cathode electrode 74 may have a stacking structure (Ti/Ni/Au) including a titanium (Ti) layer that is in direct contact with a lower surface 14 of the N+ type GaN substrate 10, a nickel (Ni) layer that is in contact with the titanium layer below the titanium layer, and a gold (Au) layer that is in contact with the nickel layer below the nickel layer.

Figure 6:
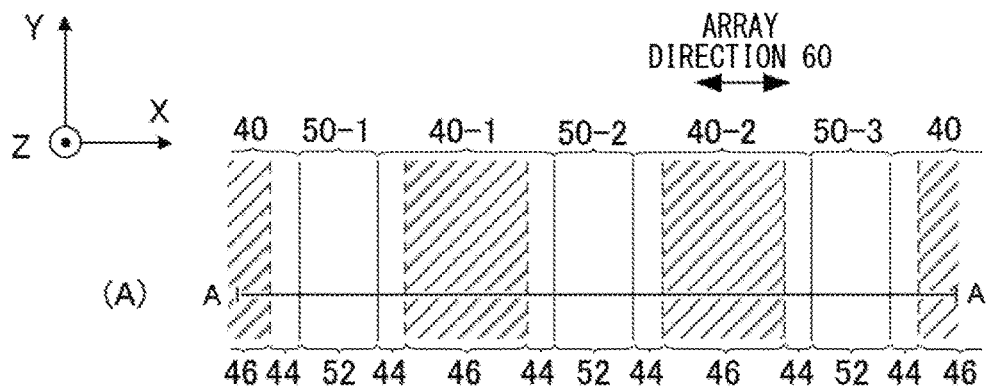
FIG. 6 shows, respectively as (A) to (C), a partially enlarged view of an active portion 92.
Figure 6:
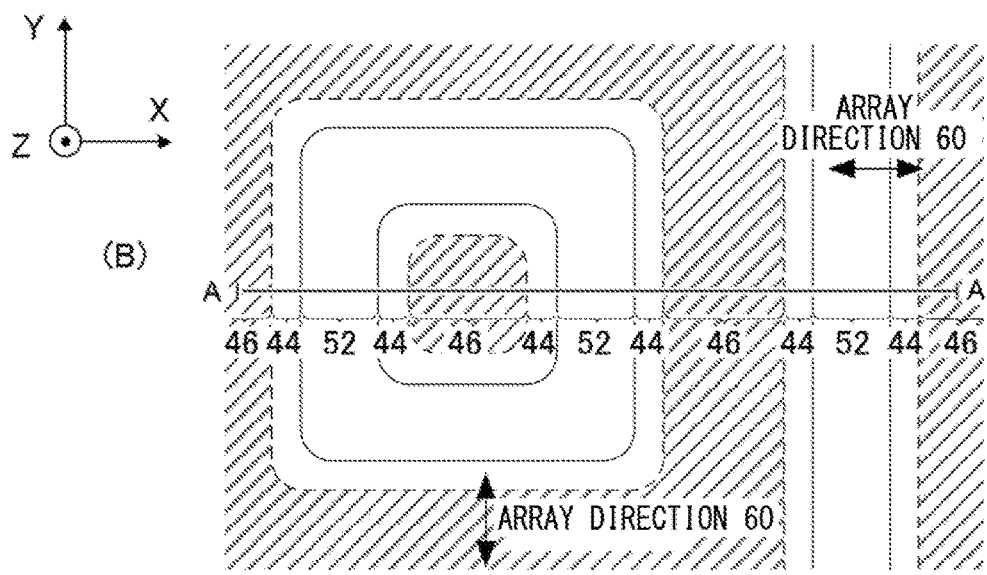
Figure 6:
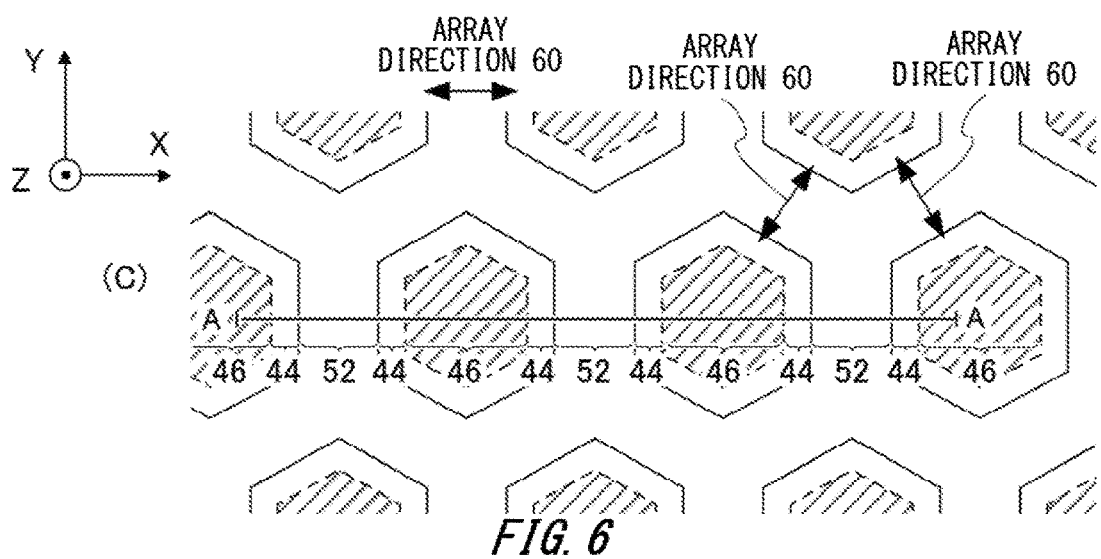

FIG. 6 shows, as each of (A) to (C), a partially enlarged view of an active portion 92. FIG. 6 shows an example, as (A), in which the trench structures 40 and the mesa structures 50 are provided in a stripe shape. FIG. 6 shows an example, as (B), in which the trench structures 40 and the mesa structures 50 are provided in concentric rectangular shapes (that is, a plurality of rectangular shapes that have the same center and are similar to each other). FIG. 6 shows an example, as (C), in which the trench structures 40 and the mesa structures 50 are provided in a honeycomb form. In FIG. 6, for an easy understanding, the bottoms 46 of the trench structures 40 are illustrated by hatched lines. Also, in FIG. 6, one example of a range corresponding to the A-A cross section of FIG. 1 and FIG. 2 is also shown.

Although any of the shapes may be adopted, the concentric rectangular shapes in (B) are relatively easier for a layout design in a case of combining the active portion 92 with an edge termination portion 98. Also, the honeycomb form in (C) is an optimal shape for the active portion 92 of the semiconductor chip 90 having a large area.

Note that in the stripe shape in (A), the array direction 60 is a direction parallel to the X-axis direction. Note that in the concentric rectangular shapes in (B), the array direction 60 may be a direction parallel to the X-axis direction and may also be a direction parallel to the Y-axis direction. Further, in the honeycomb form in (C), the array direction 60 may be a direction parallel to the X-axis direction, may be a direction parallel to a straight line forming an angle of +60 degrees with the X axis, and may also be a direction parallel to a straight line forming an angle of −60 degrees with the X axis.

Figure 7:
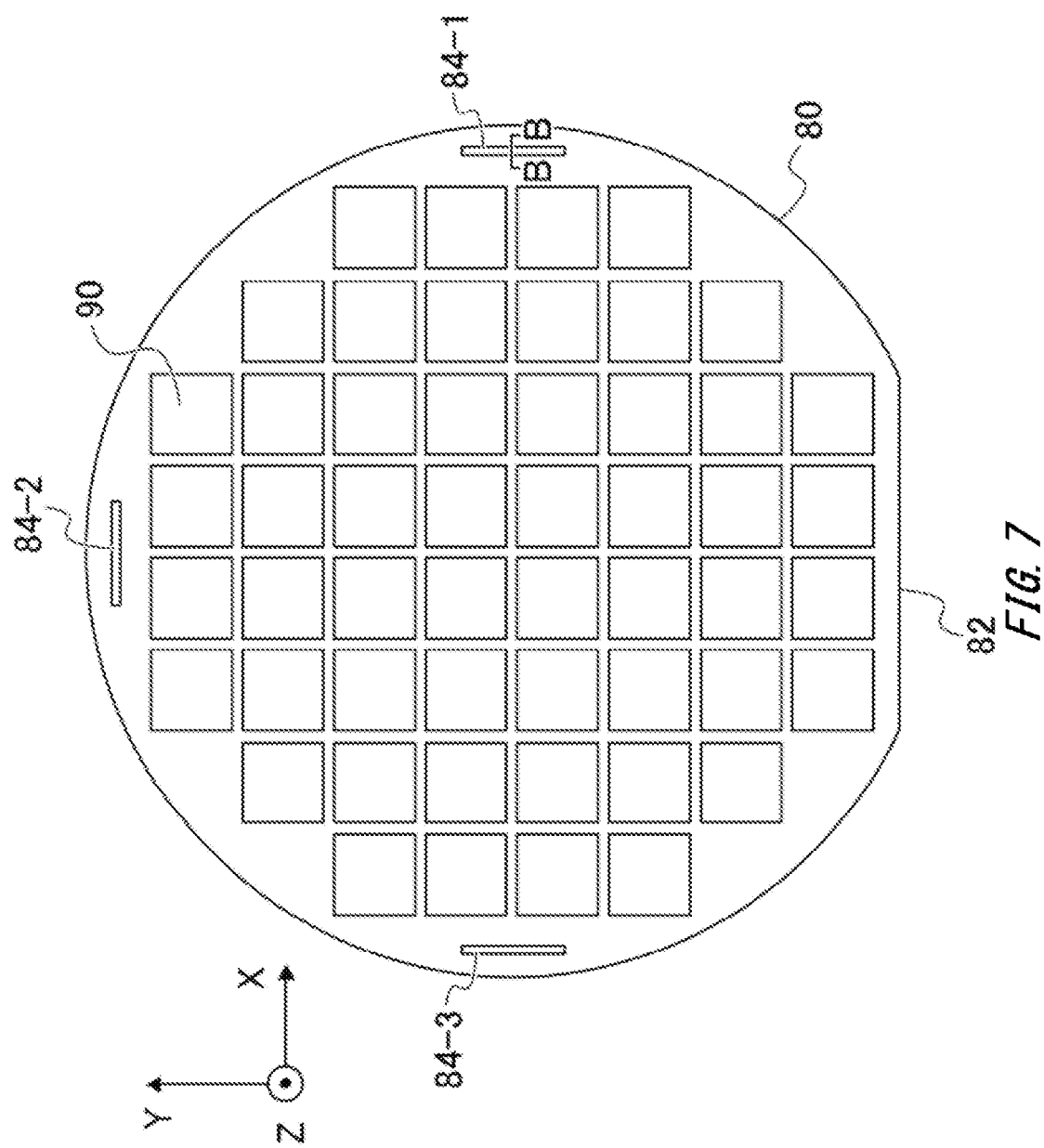
FIG. 7 shows a top view of a wafer 80 before a semiconductor chip 90 is cut out.

FIG. 7 is a top view of a wafer 80 before the semiconductor chip 90 is cut out. The wafer 80 of the present example is a GaN wafer having an orientation flat (hereinafter, OF) 82 that is a (1-100) plane. The wafer 80 of the present example has a marker 84 on an end except the OF 82. The marker 84 of the present example is a trench provided in the N type GaN layer 20. Although the marker 84 of the present example is shown in a strip shape in a top view, the marker 84 may also be shown by at least one of numbers, characters and symbols in other examples.

Figure 8:
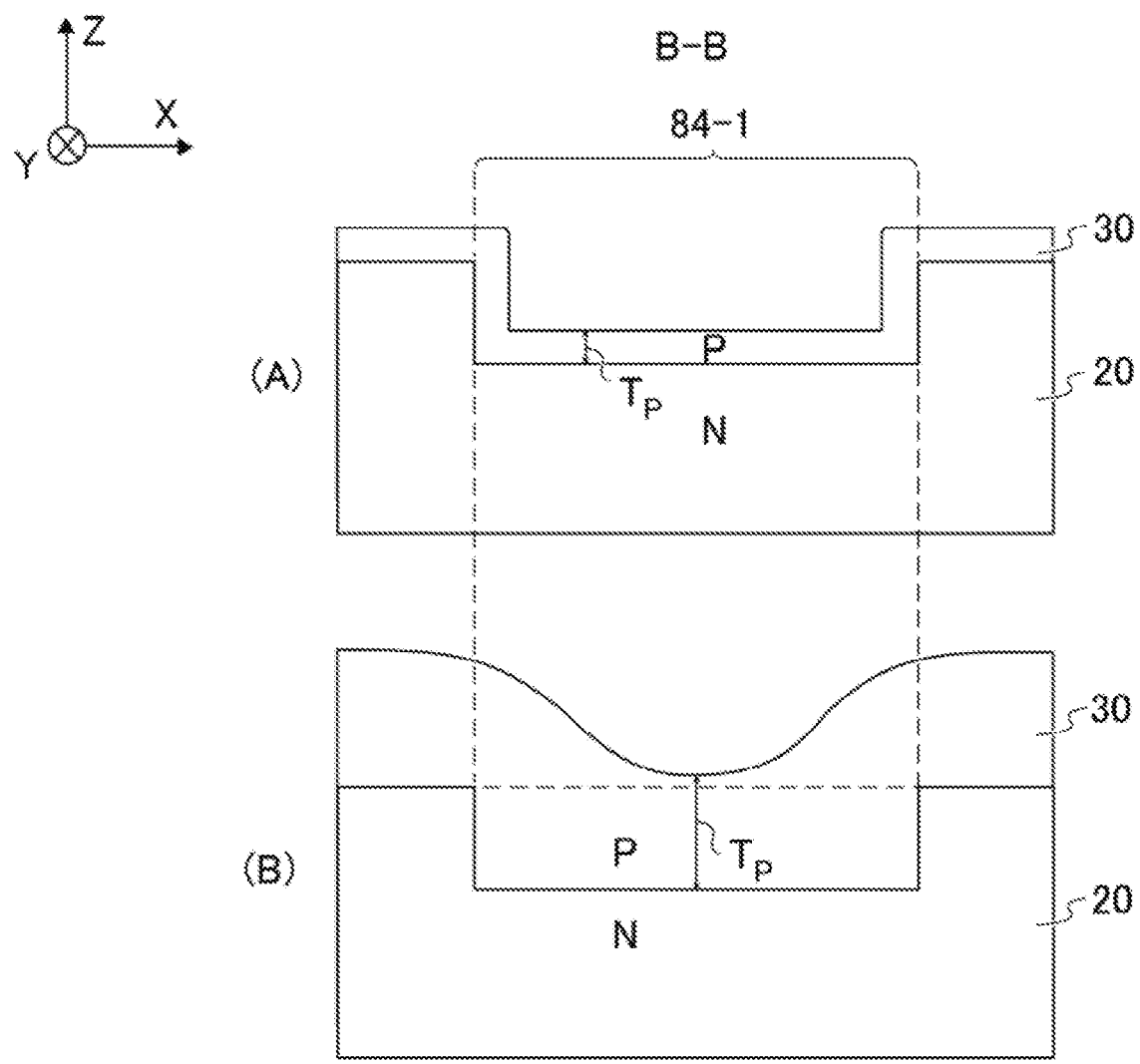
FIG. 8 shows, respectively as (A) and (B), a B-B cross-section view of FIG. 7.

FIG. 8 shows, respectively as (A) and (B), a B-B cross-section view of FIG. 7. FIG. 8 shows, as (A), a cross-section view taken along the line B-B of the present example in which the P type GaN layer 30 has such a thickness $T_P$ that the trench structure 40 is not filled. On the other hand, FIG. 8 shows, as (B), a cross-section view taken along the line B-B of another example in which the trench structure 40 is filled with the P type GaN layer 30. In the present example shown as (A) in FIG. 8, because the thickness $T_P$ is sufficiently thin, a marker is easily identified at the mask alignment for the photolithography process in the step S30 and thereafter. For that reason, a mask alignment accuracy can be higher compared to the example shown as (B) in FIG. 8.

Figure 9:
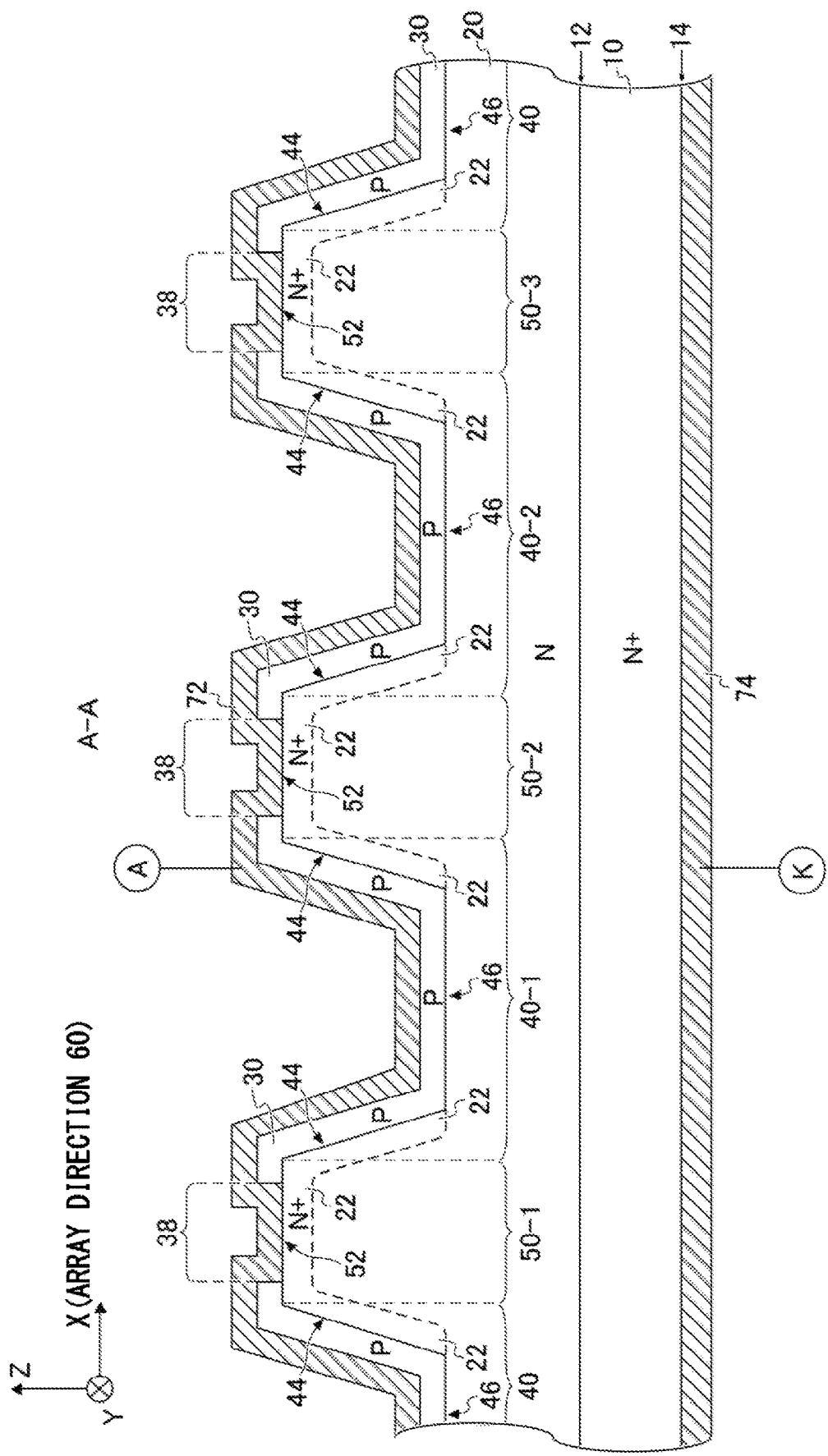
FIG. 9 shows a first modification example of the first embodiment.

FIG. 9 shows a first modification example of the first embodiment. The N type GaN layer 20 of the present example includes a high concentration region 22 in the mesa structure 50. The high concentration region 22 of the present example is an N+ type region having an N type dopant concentration higher than an N type dopant concentration of the bottom 46 of the trench structure 40. The high concentration region 22 of the present example is provided in the top portion 52 of the mesa structure 50 and the side wall 44 of the trench structure 40. The range in which the high concentration region 22 is provided in the mesa structure 50 is shown by the broken lines.

The high concentration region 22 of the present example is provided from the top portion 52 to a predetermined depth. Also, the high concentration region 22 of the present example is provided from the side wall 44 to a predetermined position inside the mesa structure 50 in a direction orthogonal to the side wall 44. Note that not the whole mesa structure 50 of the present example is set to the high concentration regions 22. In the present example, a region having an N type doping concentration that is the same as that of the N type GaN layer 20 is remained inside the mesa structure 50.

By providing the high concentration region 22, a depletion layer more hardly extends in the Z-axis direction at the time of applying the reverse bias compared to a case in which the high concentration region 22 is not provided. For that reason, by providing the high concentration region 22, the breakdown voltage can be improved. Note that by providing the high concentration region 22, because a depletion range of the P type GaN layer 30 in a case in which no bias is applied is larger compared to a case in which no high concentration region 22 is provided, device resistance is increased. For that reason, a balance between the breakdown voltage and the resistance of the diode 100 may be taken into account to provide the high concentration region 22.

In the GaN material, an N type region can be formed by ion implantation. For example, after the step S20 and before the step S30, an ion implantation of N type impurities is selectively performed into the top portion 52 and the side wall 44. Subsequently, the N type GaN layer 20 is annealed to activate the dopants. Accordingly, in the N type GaN layer 20 except the bottom 46, the high concentration region 22 can be formed to a predetermined depth.

Figure 10:
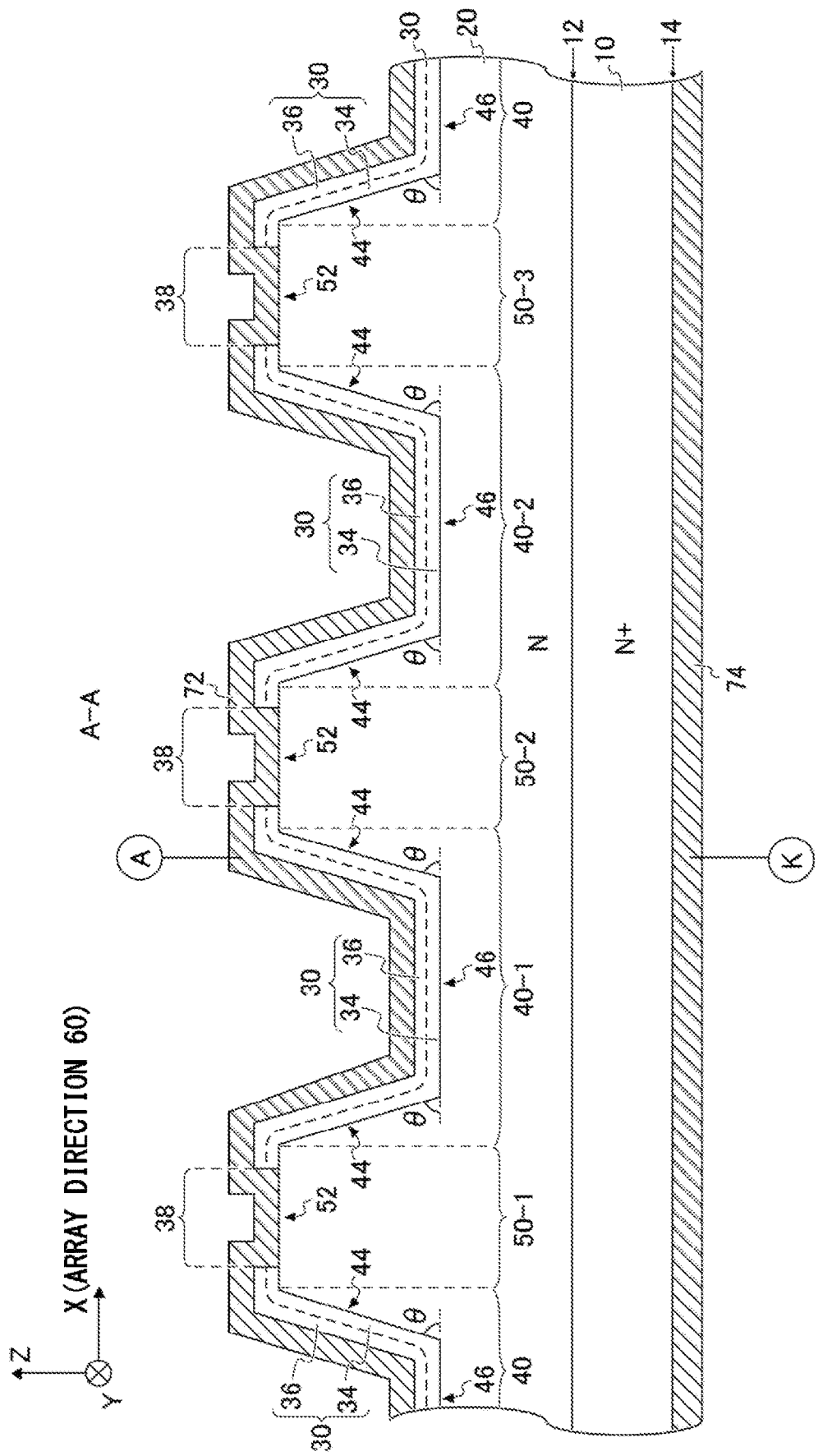
FIG. 10 shows a second modification example of the first embodiment.

FIG. 10 shows a second modification example of the first embodiment. The P type GaN layer 30 of the present example includes a P type semiconductor junction region 34 and a P+ type metal junction region 36. In the present example, the semiconductor junction region 34 is a region that is in contact with the side wall 44 of the N type GaN layer 20 of the P type GaN layer 30. Also, the metal junction region 36 is a region that is positioned on an opposite side to the semiconductor junction region 34 in a thickness direction of the P type GaN layer 30 and is in contact with the anode electrode 72. The metal junction region 36 may be provided from an exposed surface of the P type GaN layer 30 to a predetermine depth. The metal junction region 36 of the present example has a certain thickness on the side wall 44, the bottom 46 and the top portion 52.

The P type dopant concentration of the metal junction region 36 may be higher than the P type dopant concentration of the semiconductor junction region 34. In a latter part of the step S40, by increasing a flow rate of $Cp_2Mg$ per unit time, a region from an uppermost surface of the P type GaN layer 30 to a predetermine depth can be set as the P+ type metal junction region 36. Accordingly, compared to a case in which no P+ type metal junction region 36 is provided, contact resistance between the P type GaN layer 30 and the anode electrode 72 can be more reduced. Note that the first modification example and the second modification example may also be combined.

Figure 11:
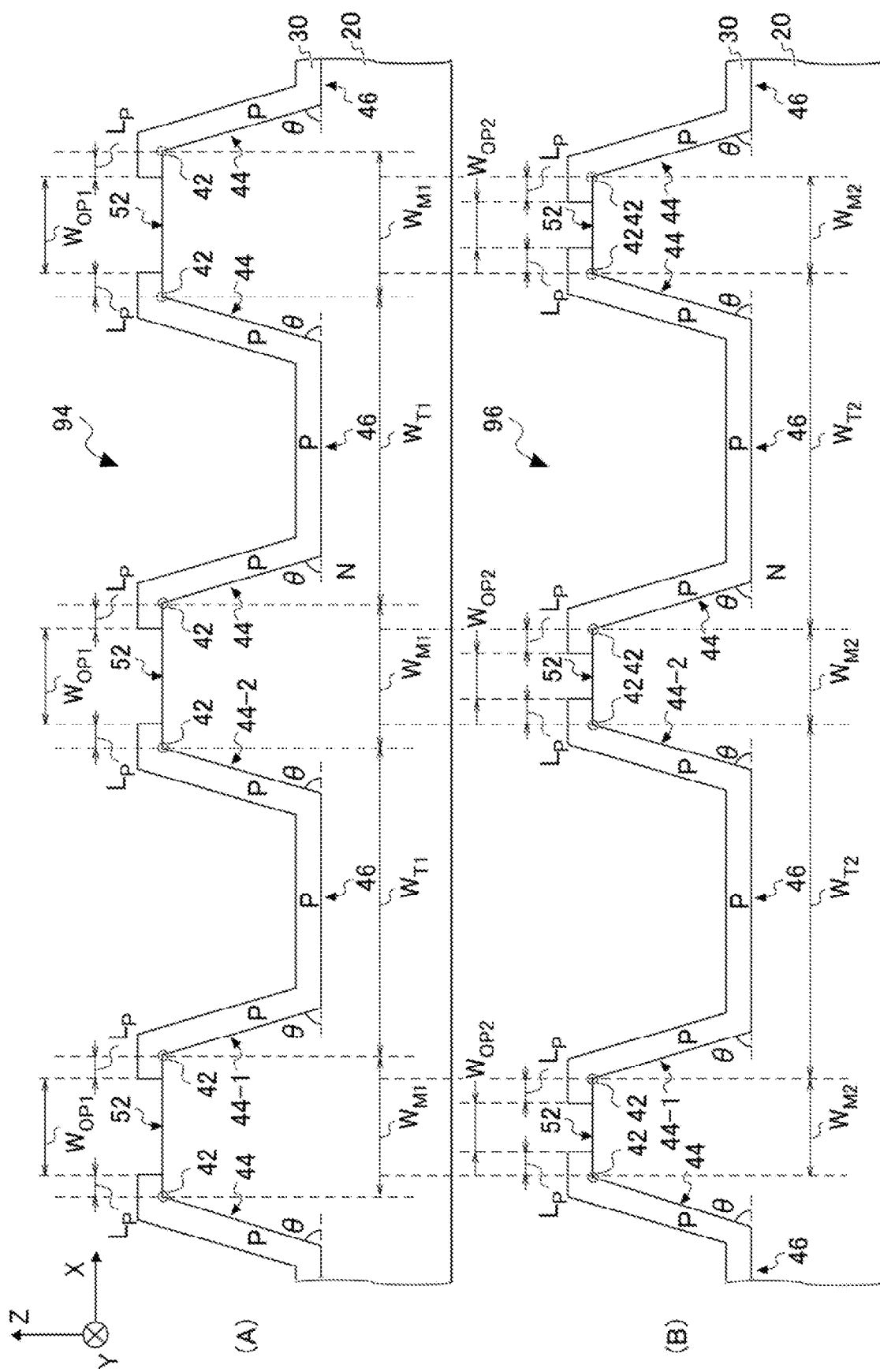
FIG. 11 shows a third modification example of the first embodiment.

FIG. 11 shows a third modification example of the first embodiment. FIG. 11 shows, as (A), an X-Z cross section of a Schottky characteristic region 94 having a relatively large ratio of a width $W_{M1}$ of the mesa structure 50 to a width $W_{T1}$ of the trench structure 40 ($W_{M1}/W_{T1}$). On the other hand, FIG. 11 shows, as (B), an X-Z cross section of a P-N junction characteristic region 96 having a relatively small ratio of a width $W_{M2}$ of the mesa structure 50 to a width $W_{T2}$ of the trench structure 40 ($W_{M2}/W_{T2}$).

In the present example, the angle θ is constant in the Schottky characteristic region 94 and the P-N junction characteristic region 96. In the present example, the length $L_P$ of the P type GaN layer 30 is constant in every region in which the P type GaN layer 30 is respectively provided, and the width $W_M$ of the mesa structure 50 respectively in two regions is different. For that reason, a width $W_{OP1}$ of the opening 38 in the Schottky characteristic region 94 can be set to be larger compared to a width $W_{OP2}$ of the opening 38 in the P-N junction characteristic region 96 ($W_{OP2}<W_{OP1}$). The Schottky characteristic region 94 may have a larger contact area compared to that of the P-N junction characteristic region 96, the contact area with the anode electrode 72 and the N type GaN layer 20 in each top portion 52. For that reason, the Schottky characteristic region 94 may have stronger Schottky characteristic than that of the P-N junction characteristic region 96, and the P-N junction characteristic region 96 may have stronger P-N junction characteristic than that of the Schottky characteristic region 94. In this way, by providing regions having characteristic different from each other within one semiconductor chip 90, flexibility of design of current-voltage characteristics can be enhanced, for example.

Note that as long as a contact area between the anode electrode 72 and the N type GaN layer 20 can be set larger in the Schottky characteristic region 94 compared to that in the P-N junction characteristic region 96, other configurations may also be adopted. In another example, by setting $W_{M1}/W_{T1}=W_{M2}/W_{T2}$ and then setting the length $L_P$ of the Schottky characteristic region 94 smaller than the length $L_P$ of the P-N junction characteristic region 96, the width $W_{OP1}$ may also be set larger than the width $W_{OP2}$. In another further example, by setting the length $L_P$ constant in every region and then setting an angle $θ_1$ of the Schottky characteristic region 94 larger than an angle $θ_2$ of the P-N junction characteristic region 96, the contact area between the anode electrode 72 and the N type GaN layer 20 in the Schottky characteristic region 94 may also be set larger compared to that in the P-N junction characteristic region 96.

The Schottky characteristic region 94 and the P-N junction characteristic region 96 may be provided to be arrayed in line in the array direction 60. In the stripe shape of (A) shown in FIG. 6, one of the Schottky characteristic region 94 and the P-N junction characteristic region 96 may be provided in the positive side of the X-axis direction of a predetermined X-position, and the other thereof may be provided in the negative side of the X-axis direction of the predetermined X-position. Also, in the concentric rectangular shapes of (B) shown in FIG. 6 and the honeycomb form of (C) shown in FIG. 6, one of the Schottky characteristic region 94 and the P-N junction characteristic region 96 may be provided more inside than a predetermined range on the X-Y plane, and the other of the Schottky characteristic region 94 and the P-N junction characteristic region 96 may be provided more outside than the predetermined range.

Figure 12:
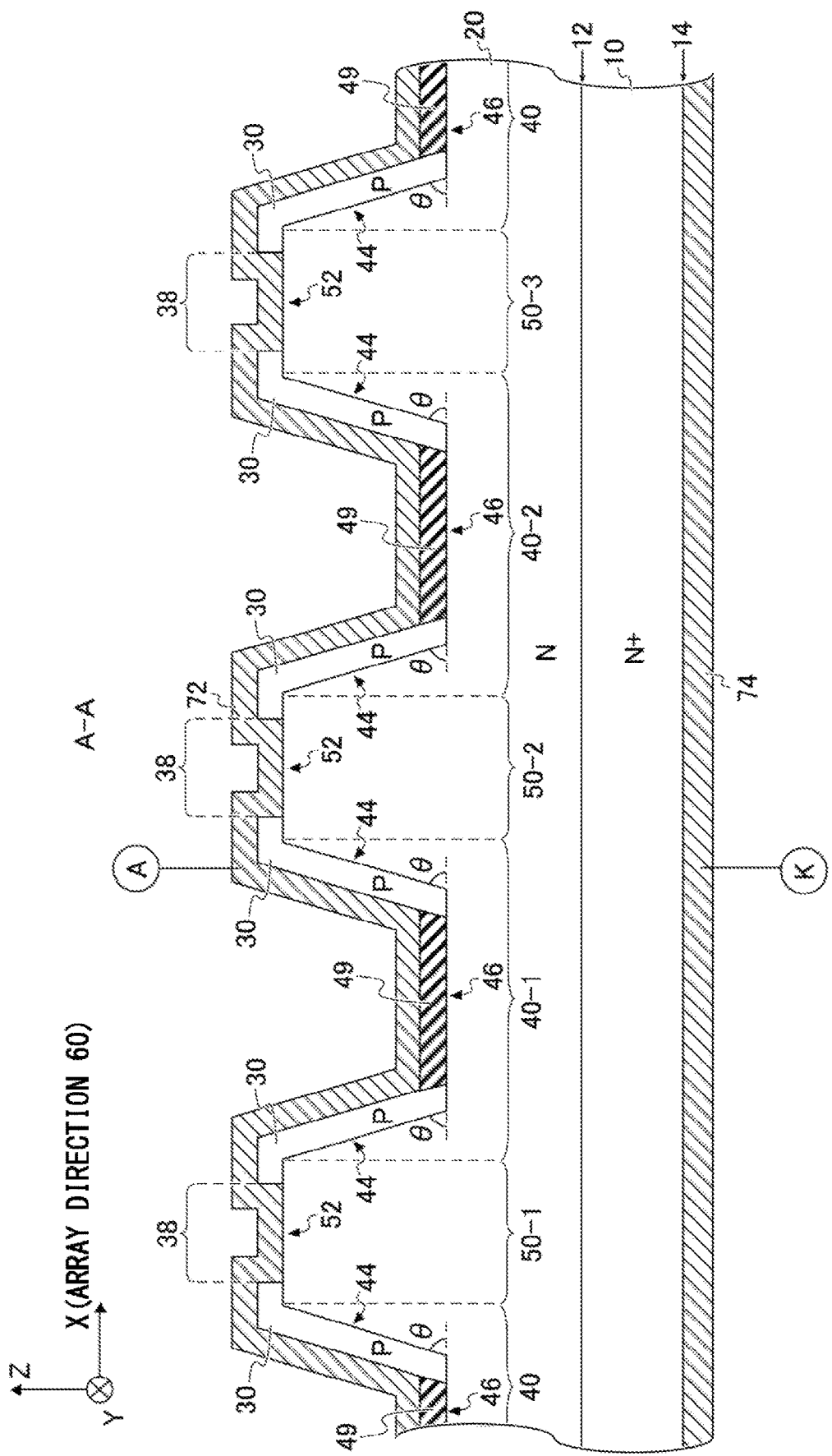
FIG. 12 shows an A-A cross-section view of FIG. 1 in a second embodiment.

FIG. 12 shows the A-A cross-section view of FIG. 1 in a second embodiment. In the present example, the P type GaN layer 30 is not provided on the entire bottom 46. The diode 100 of the present example has an insulating film 49 instead of the P type GaN layer 30 in contact with the bottom 46. The present example is different from the first embodiment in this point. For example, in the step S40, by etching a predetermined range corresponding to the top portion 52 and the bottom 46 through a mask layer having an opening, am opening can be formed on the top portion 52 and the bottom 46. Subsequently, after blanket-depositing the insulating film 49, the insulating film 49 except the portion in contact with the bottom 46 is removed by etching. In the present example as well, difficulty of forming the P type GaN layer by the ion implantation or the selective regrowth can be avoided.

Figure 13:
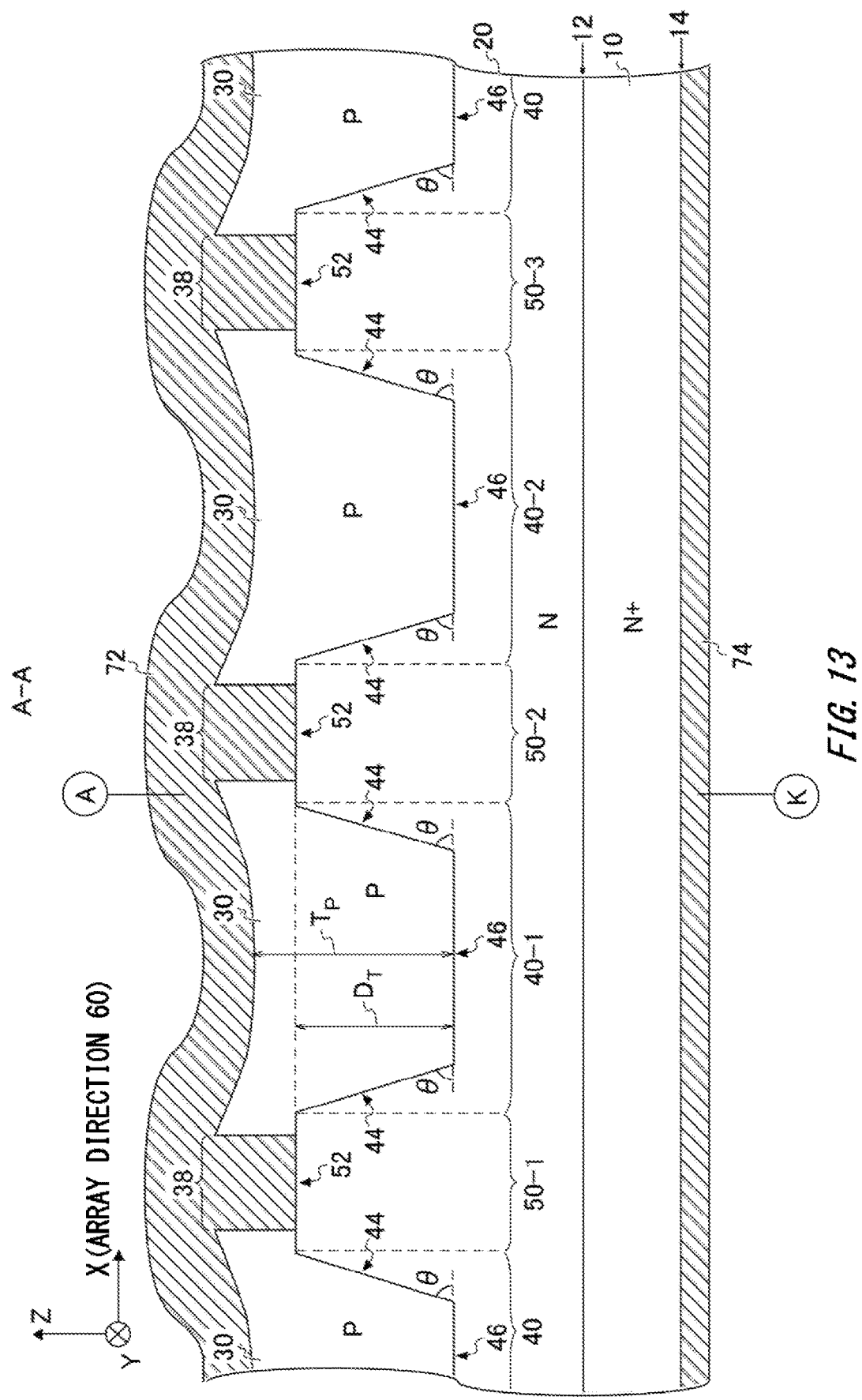
FIG. 13 shows an A-A cross-section view of FIG. 1 in a third embodiment.

FIG. 13 shows an A-A cross-section view of FIG. 1 in a third embodiment. In the present example, the thickness $T_P$ of the P type GaN layer 30 in contact with the bottom 46 is larger than the depth $D_T$ of the trench structure 40. The present example is different from the first embodiment in this point. Note that in the present example as well, the difficulty of forming the P type GaN layer by the ion implantation or the selective regrowth can be avoided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A diode comprising:
 a semiconductor layer of a first conductivity type having a trench structure and being an epitaxial layer of a wide gap semiconductor;
 a semiconductor layer of a second conductivity type being at least in contact with a side wall of the trench structure and being an epitaxial layer of the wide gap semiconductor; and
 an electrode provided on the semiconductor layer of the first conductivity type and the semiconductor layer of the second conductivity type, the electrode being in contact with the semiconductor layer of the first conductivity type and the semiconductor layer of the second conductivity type, wherein
 an angle formed by the side wall and a bottom of the trench structure between 40 degrees and 60 degrees, inclusive.

2. The diode according to claim 1, wherein
 the angle is between 40 degrees inclusive and 50 degrees exclusive.

3. A diode comprising:
 a semiconductor layer of a first conductivity type, configured to have a trench structure and be an epitaxial layer of a wide gap semiconductor;
 a semiconductor layer of a second conductivity type, configured to be at least in contact with a side wall of the trench structure and be an epitaxial layer of the wide gap semiconductor; and
 an electrode configured to be in contact with the semiconductor layer of the first conductivity type and the semiconductor layer of the second conductivity type, on the semiconductor layer of the first conductivity type and the semiconductor layer of the second conductivity type, wherein
 the semiconductor layer of the first conductivity type has:
 a first trench structure and a second trench structure that are provided adjacent to each other in an array direction in which a plurality of trench structures, including the trench structure, are arrayed to be spaced away from each other; and
 a mesa structure that is positioned between the first trench structure and the second trench structure in the array direction, and
 the semiconductor layer of the first conductivity type includes, respectively in a top portion of the mesa structure and side walls of the first and the second trench structures, a high concentration region having a higher dopant concentration of a first conductivity type than a dopant concentration of a first conductivity type in a bottom of each of the first and the second trench structures.

4. A diode comprising:
 a semiconductor layer of a first conductivity type configured to have a trench structure and be an epitaxial layer of a wide gap semiconductor;
 a semiconductor layer of a second conductivity type, configured to be at least in contact with a side wall of the trench structure and be an epitaxial layer of the wide gap semiconductor; and
 an electrode configured to be in contact with the semiconductor layer of the first conductivity type and the semiconductor layer of the second conductivity type, on the semiconductor layer of the first conductivity type and the semiconductor layer of the second conductivity type, wherein
 the semiconductor layer of the first conductivity type has:
 a first trench structure and a second trench structure that are provided adjacent to each other in an array direction in which a plurality of trench structures, including the trench structure, are arrayed to be spaced away from each other; and
 a mesa structure that is positioned between the first trench structure and the second trench structure in the array direction,
 the semiconductor layer of the second conductivity type includes:
 a semiconductor junction region that is in contact with the semiconductor layer of the first conductivity type; and
 a metal junction region that is positioned on an opposite side to the semiconductor junction region in a thickness direction of the semiconductor layer of the second conductivity type and that is in contact with the electrode, and
 a dopant concentration of a second conductivity type of the metal junction region is higher than a dopant concentration of a second conductivity type of the semiconductor junction region.

5. The diode according to claim 3, wherein
 a width of the mesa structure in the array direction is between 0.5 µm and 10 µm, inclusive.

6. The diode according to claim 3, wherein
 a width of the trench structure between a first side wall and a second side wall of the trench structure, the first side wall and the second side wall facing each other in the array direction, is between 1 µm and 50 µm, inclusive, the width of the trench structure defined as a length between a top portion of the first side wall and a top portion of the second side wall.

7. The diode according to claim 3, wherein
 a width of the trench structure is as 1 time or more as a width of the mesa structure in the array direction.

8. The diode according to claim 1, wherein
 the wide gap semiconductor is gallium nitride.

9. The diode according to claim 1, wherein
 the first conductivity type is N type.

10. The diode according to claim 1, wherein
 the semiconductor layer of the second conductivity type is in contact with the entire bottom of the trench structure.

11. The diode according to claim 1, wherein
 a thickness of the semiconductor layer of the second conductivity type is smaller than a depth of the trench structure, the depth of the trench structure being a length from a top portion of the side wall to a bottom of the trench structure.

\* \* \* \* \*